United States Patent
Yen et al.

(10) Patent No.: US 7,271,625 B2
(45) Date of Patent: Sep. 18, 2007

(54) SAMPLE-AND-HOLD DEVICE HAVING INPUT STAGES OF AMPLIFIER COUPLED TO CAPACITORS

(75) Inventors: Chih-Jen Yen, Hsinchu (TW); Yueh-Hsiu Liu, Taipei (TW)

(73) Assignee: Novatek Microelectronics Corp., Hsinchu (TW)

( * ) Notice: Subject to any disclaimer, the term of this patent is extended or adjusted under 35 U.S.C. 154(b) by 58 days.

(21) Appl. No.: 11/163,355

(22) Filed: Oct. 17, 2005

(65) Prior Publication Data

US 2007/0013416 A1   Jan. 18, 2007

(30) Foreign Application Priority Data

Jul. 12, 2005   (TW) ............................... 94123504 A

(51) Int. Cl.
  *H03K 5/00*   (2006.01)
(52) U.S. Cl. ............................. 327/94; 327/95; 327/96
(58) Field of Classification Search ............. 327/94–96
See application file for complete search history.

(56) References Cited

U.S. PATENT DOCUMENTS 5,959,470 A * 9/1999 Sugihashi ..................... 327/94
6,628,148 B2 * 9/2003 Shirasaki ...................... 327/95

* cited by examiner

*Primary Examiner*—Kenneth B. Wells
(74) *Attorney, Agent, or Firm*—Jianq Chyun IP Office

(57) ABSTRACT

A sample-and-hold device including first and second capacitors, first and second switches, amplifier and feedback network is provided. The amplifier includes first and second input stages, output stage and switchable bias current source. The first switch and the first capacitor are coupled in series between input signal and first voltage, and a common node is coupled to a first positive input terminal of the amplifier. The first switch is on during first period and off during second period. The second switch and the second capacitor are coupled in series between the input signal and second voltage, and a common node is coupled to a second positive input terminal of the amplifier. The second switch is on during second period and off during first period. The switchable bias current source biases the second input stage during first period, and switches to bias the first input stage during second period.

16 Claims, 9 Drawing Sheets

US 7,271,625 B2

SAMPLE-AND-HOLD DEVICE HAVING INPUT STAGES OF AMPLIFIER COUPLED TO CAPACITORS

CROSS-REFERENCE TO RELATED APPLICATION

This application claims the priority benefit of Taiwan application serial no. 94123504, filed on Jul. 12, 2005. All disclosure of the Taiwan application is incorporated herein by reference.

BACKGROUND OF THE INVENTION

1. Field of Invention

The present invention relates to a sample-and-hold (S/H) device. More particularly, the present invention relates to a sample-and-hold device having a plurality of input stages.

2. Description of Related Art

FIG. 1 is a circuit diagram illustrating a conventional sample-and-hold device having an input stage. Referring to FIG. 1, the sample-and-hold device 100 includes switches S1~S4, capacitors C1~C2 and an amplifier 110. The amplifier 100 includes, for example, an input stage 120 and an output stage 140, in which the input stage 120 includes a differential input unit 121 and a bias current source I1.

The switches S1~S4 are controlled by a plurality of non-overlapping clock signals so as to determine whether the switches should be turned on or turned off. During the first period, switches S1 and S4 are turned on while switches S2 and S3 are turned off, the sample-and-hold device 100 stores the input voltage $V_{in}$ in the capacitor C1, and meanwhile, obtains the output voltage $V_{out}$ from the electric charge stored in the capacitor C2. Then during the second period, switches S1 and S4 are turned off and switches S2 and S3 are turned on, the sample-and-hold device 100 obtains the output voltage $V_{out}$ from the electric charge stored in the capacitor C1 and stores the next input voltage $V_{in}$ in the capacitor C2.

However, in the input stage 120 of the amplifier 110, there will be a parasitic capacitor at its positive input terminal, thus the output voltage $V_{out}$ of the amplifier 110 may be distorted by the sample-and-hold device 100 due to charge sharing.

For example, during the first period, switch S1 is turned on and switch S3 is turned off, thus the capacitor C1 stores an amount of electric charge $C_1 V_{in}$, in which $C_1$ represents the capacitance of the capacitor C1. During the second period, switch S1 is turned off and switch S3 is turned on, at this point, part of the electric charge stored in the capacitor C1 flows to the parasitic capacitor at the positive input terminal of the input stage 120 due to charge sharing. Therefore, the voltage level supplied to the positive input terminal of the input stage 120 in fact is distorted to $C_1 V_{in}/(C_1+C_{P1})$, in which $C_{P1}$ represents the capacitance of the parasitic capacitor at the positive input terminal of the input stage 120. The voltage level distortion at the positive input terminal of the input stage will cause the distortion of the output voltage $V_{out}$ of the amplifier 110. The same problem may as well occur in the capacitor C2 and the input stage 120 which has also charge sharing during the first period while switch S4 is turned on and switch S2 is turned off.

SUMMARY OF THE INVENTION

Accordingly, the present invention is directed to provide a sample-and-hold device which will avoid sampling distortion caused by charge sharing, reduce the chip size, increase the response speed of the amplifier and avoid voltage spike.

Based on these and other aspects, the present invention provides a sample-and-hold device including a first and a second capacitors, a first and a second switches, an amplifier and a feedback network. In which the amplifier including a first and a second positive input terminals, a first and a second negative input terminals and an output terminal. In addition, the amplifier includes a first and a second input stages, an output stage and a switchable bias current source.

In the sample-and-hold device, the first switch and the first capacitor are coupled in series between the input signal and the first voltage, and a common node thereof is coupled to the first positive input terminal. The second switch and the second capacitor are coupled in series between the input signal and the second voltage, and a common node thereof is coupled to the second positive input terminal. In which, the first switch is turned on during the first period to transmit the input signal to the first capacitor to store the first sampling result of the input signal in the first capacitor, and it is turned off during the second period. The second switch is turned on during the second period to transmit the input signal to the second capacitor to store the second sampling result of the input signal in the second capacitor, and it is turned off during the first period.

In the sample-and-hold device, the first input stage of the amplifier is coupled to the first positive input terminal and the first negative input terminal, the second input stage is coupled to the second positive input terminal and the second negative input terminal, and the output stage is coupled to the first and the second input stages to provide an output signal to the output terminal according to outputs of the first and the second input stages. The switchable bias current source of the amplifier biases the second input stage during the first period, and switches to bias the first input stage during the second period. In addition, the feedback network provides a feedback signal to the first and the second negative input terminals of the amplifier according to the output signal.

In another aspect of the present invention, another sample-and-hold device is provided which includes a first and a second switches, an amplifier and a feedback network. In which, the amplifier including a first and a second positive input terminals, a first and a second negative input terminals and an output terminal. In addition, the amplifier includes a first input stage having a first parasitic capacitor, a second input stage having a second parasitic capacitor, an output stage and a switchable bias current source.

In the sample-and-hold device, the first terminal of the first switch receives the input signal, and the second terminal of the first switch is coupled to the first positive input terminal. The first terminal of the second switch receives the input signal, and the second terminal of the second switch is coupled to the second positive input terminal. In which, the first switch is turned on during the first period to transmit the input signal to the first parasitic capacitor to store the first sampling result of the input signal to the first parasitic capacitor, and it is turned off during the second period. The second switch is turned on during the second period to transmit the input signal to the second parasitic capacitor to store the second sampling result of the input signal in the second parasitic capacitor, and it is turned off during the first period.

In the sample-and-hold device, the first input stage of the amplifier is coupled to the first positive input terminal and the first negative input terminal, the second input stage is coupled to the second positive input terminal and the second negative input terminal, and the output stage is coupled to the first and the second input stages to provides an output signal to the output terminal according to outputs of the first and the second input stages. The switchable bias current source of the amplifier biases the second input stage during the first period, and switches to bias the first input stage during the second period. In addition, the feedback network provides a feedback signal to the first and second negative input terminals of the amplifier according to the output signal.

According to the present invention, since the input stages of the amplifier are coupled to the capacitors for sampling data without connecting through switches and the switches are disposed in the amplifier, so that the output distortion caused by the charge sharing effect is avoided. In addition, with a plurality of input stages sharing one bias current source, the chip size is reduced, the response speed of the amplifier is increased and the voltage spike is avoided.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 2:
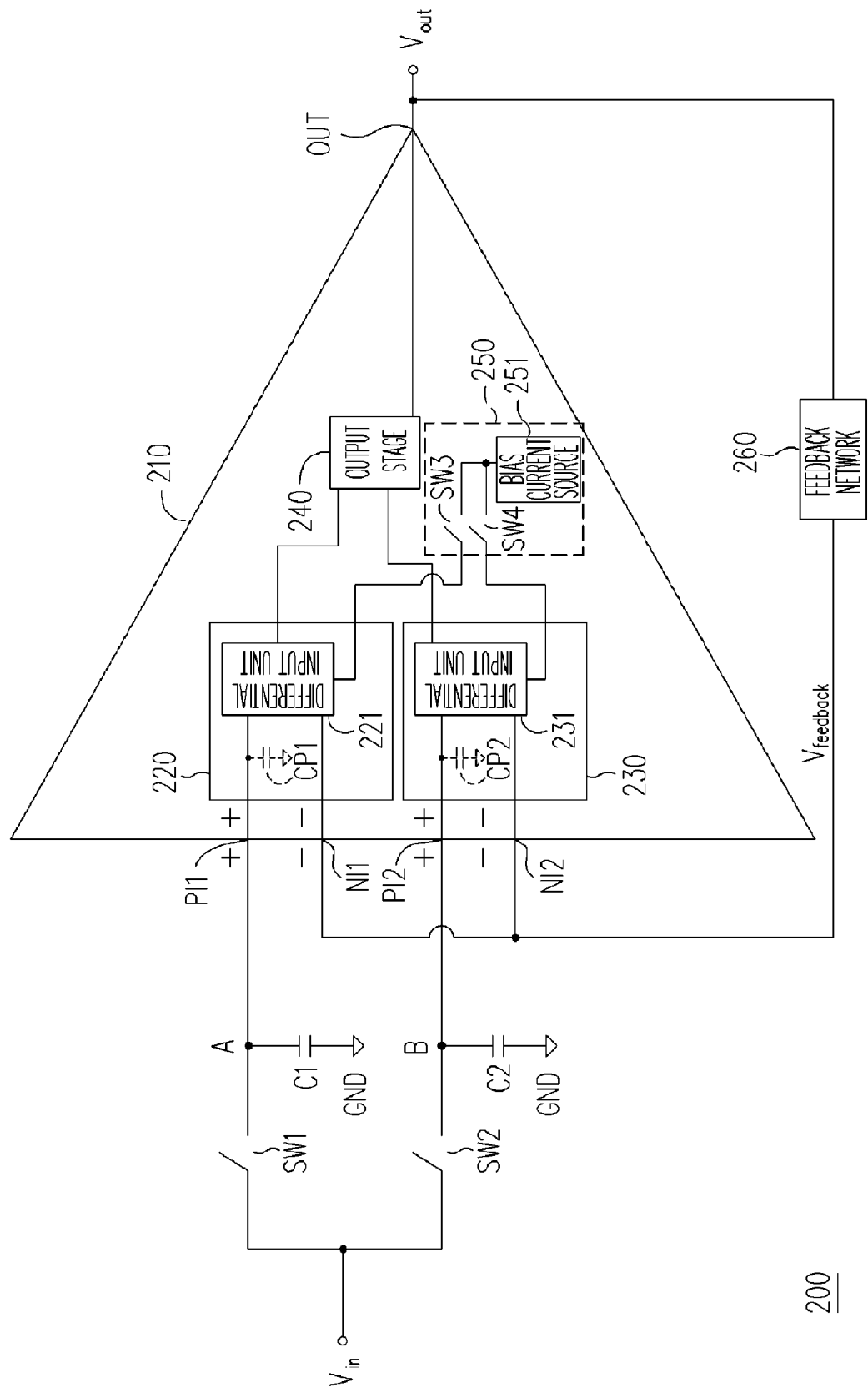
FIG. 2 is a circuit diagram illustrating a sample-and-hold device having a plurality of input stages according to an exemplary embodiment of the present invention; in this embodiment, the sample-and-hold device having two input stages is described.

FIG. 2 is a circuit diagram illustrating a sample-and-hold device having a plurality of input stages according to an exemplary embodiment of the present invention. In this embodiment, the sample-and-hold device has two input stages. Referring to FIG. 2, the sample-and-hold device 200 includes a first switch SW1, a second switch SW2, a first capacitor C1, a second capacitor C2, an amplifier 210 and a feedback network 260. In which, components of the amplifier 210 include a first input stage 220, a second input stage 230, an output stage 240 and a switchable bias current source 250. The input/output terminals of the amplifier 210 include a first positive input terminal PI1, a second positive input terminal PI2, a first negative input terminal NI1, a second negative input terminal NI2 and an output terminal OUT.

In addition, the switchable bias current source 250 includes a third switch SW3, a fourth switch SW4 and a bias current source 251. And, the first input stage 220 includes a differential input unit 221 which has to be provided with a bias current by the bias current source 250 to work properly, and the differential input signal is received by the first positive input terminal PI1 and the first negative input terminal NI1. Those who are skilled in this art should know that differential input units are generally formed by MOS transistors, for example, there will be a parasitic capacitor between the gate terminal and the body terminal of a transistor, and it corresponds to having a first parasitic capacitor CP1 between the input terminal of the amplifier and the ground if the body is grounded. Similarly, the second input stage 230 includes a differential input unit 231 and a second parasitic capacitor CP2.

In the sample-and-hold device 200, the first input stage 220 of the amplifier 210 is coupled to the first positive input terminal PI1 and the first negative input terminal NI1, the second input stage 230 is coupled to the second positive input terminal PI2 and the second negative input terminal NI2, and the output stage 240 provides an output signal $V_{out}$ to the output terminal OUT according to outputs of the first input stage 220 and the second input stage 230. In addition, the feedback network 260 provides a feedback signal $V_{feedback}$ to the first negative input terminal NI1 and the second negative input terminal NI2 of the amplifier 210 according to the output signal $V_{out}$.

In the sample-and-hold device 200, the first switch SW1 and the first capacitor C1 are coupled in series between the input signal $V_{in}$ and the first voltage (i.e. ground voltage GND in the present example), and a common node A is coupled to the first positive input terminal PI1. The second switch SW2 and the second capacitor C2 are coupled in series between the input signal $V_{in}$ and the second voltage (i.e. ground voltage GND in the present example), and a common node B is coupled to the second positive input terminal PI2.

As to the first channel (i.e. the input signal $V_{in}$ is inputted to the amplifier 210 through the operations of the first switch SW1 and the first capacitor C1), during the first period, the first switch SW1 is turned on while the third switch SW3 is turned off, thus the input signal $V_{in}$ is transmitted to the first capacitor C1 and the first parasitic capacitor CP1 to be stored. Thereby it corresponds to sampling the input signal $V_{in}$, and the first sampling result is stored in the first capacitor C1 (and the first parasitic capacitor CP1). Next, during the second period, the first switch SW1 is turned off while the third switch SW3 is turned on, thus the first sampling result stored in the first capacitor C1 will not be affected by the input signal $V_{in}$ and will be kept until the next period.

Figure 1:
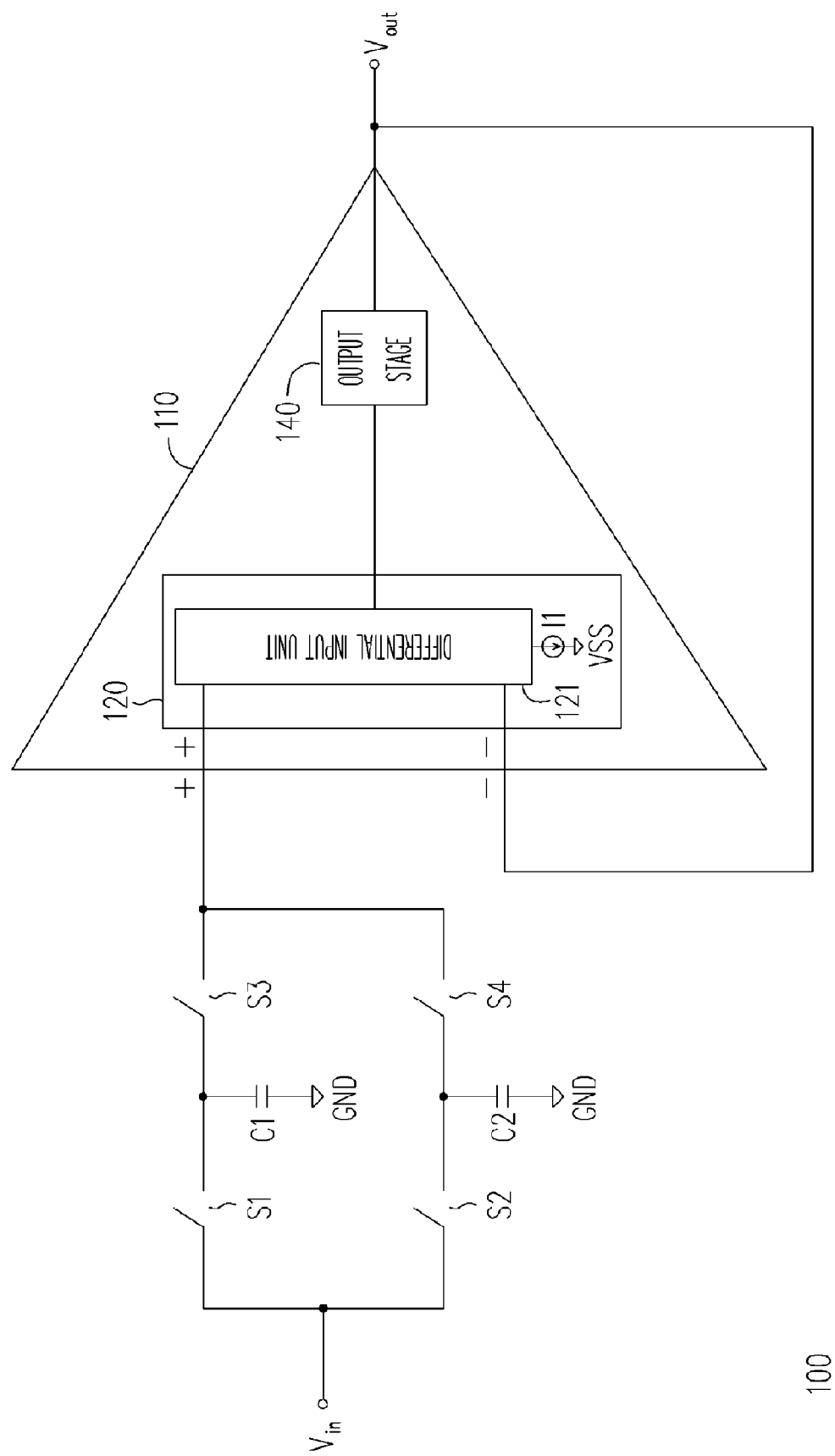
FIG. 1 is a circuit diagram illustrating a conventional sample-and-hold device having an input stage.

Since both the first capacitor C1 and the first parasitic capacitor CP1 store the first sampling result of the input signal $V_{in}$ during the first period, thus the first capacitor C1 does not have part of electric charge flowing to the first parasitic capacitor CP1 of the first positive input terminal PI1 during the second period as the sample-and-hold device 100 illustrated in FIG. 1. Accordingly, output distortion caused by the charge sharing effect will not occur.

Contrarily, as to the second channel (i.e. the input signal $V_{in}$ is inputted to the amplifier 210 through the operations of the second switch SW2 and the second capacitor C2), during the first period, the second switch SW2 is turned off while the fourth switch SW4 is turned on, and during the second period, the second switch SW2 is turned on while the fourth switch SW4 is turned off. Accordingly, the second channel keeps the sampling result from its prior period when the first channel is sampling, and the second channel samples when the first channel is keeping the sampling result from its prior period.

In fact, the first input stage 220 and the second input stage 230 will not work simultaneously, so with the control of the switchable bias current source 250, only the second input stage 230 is biased during the first period, and only the first input stage 220 is biased during the second period. With these two input stages sharing the same bias current source, there are other additional advantages besides reducing the chip area to reduce the cost.

If the input stages 220 and 230 of the sample-and-hold device 200 in FIG. 2 do not share the bias current source 251 by using switches SW3 and SW4, instead, the switch SW3 and a bias current source IB1 are disposed in the first input stage 220, and the switch SW4 and another bias current source IB2 are disposed in the second input stage 230. Thereby even though the charge sharing problem can be avoided, the bias current source IB1 may stop providing current due to the turn-off of switch SW3. Consequently, the bias current source IB1 needs a response time when it has to provide current because the switch SW3 is turned on during the next period (the bias current source IB2 may have the same situation).

Accordingly, in the sample-and-hold device 200 designed according to aspects of the present invention, the common bias current source 251 outputs bias current during both the first and the second periods to make the amplifier responds faster. In addition, the common bias current source 251 outputs bias current during both the first and the second periods so that voltage spike will not be incurred at the moment of turning on or turning off the switches.

FIGS. 3A~3D are diagrams illustrating the amplifier 210 of the sample-and-hold device 200 according to an exemplary embodiment of the present invention. For the convenience of description, the reference numerals of the elements in the following figures refer to the amplifier 210 in FIG. 2, and like reference numerals refer to the like elements, the difference of FIGS. 3A~3D is only in the implementation. Moreover, to simplify the figures, the circuit implementation of only a part of elements of the amplifier 210 is illustrated, i.e. the first input stage 220, the second input stage 230 and the switchable bias current source 250.

Figure 3A:
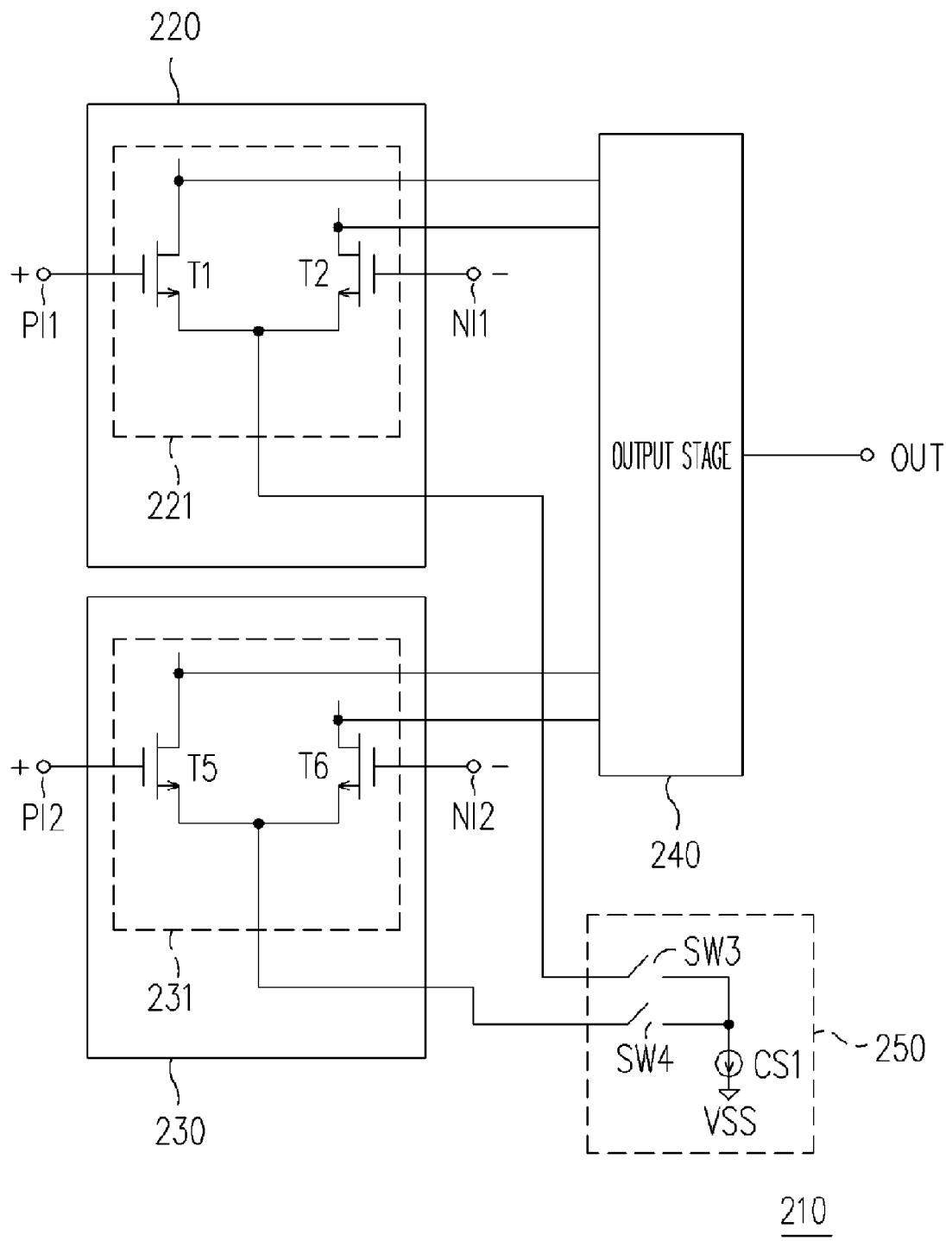
FIGS. 3A~3D are diagrams illustrating the amplifier of a sample-and-hold device according to an exemplary embodiment of the present invention.

Referring to FIG. 3A, it illustrates an embodiment of the amplifier 210. The amplifier 210 includes the first input stage 220, the second input stage 230, the output stage 240 and the switchable bias current source 250. The first input stage 220 includes the differential input unit 221 which includes the first transistor T1 and the second transistor T2; the second input stage 230 includes the differential input unit 231 which includes the fifth transistor T5 and the sixth transistor T6. In fact, the first input stage 220 and the second input stage 230 have the same structure. Here the transistors T1, T2, T5 and T6 are implemented with, for example, NMOS transistors. The switchable bias current source 250 includes the third switch SW3, the fourth switch SW4 and the first bias current source CS1; the power supply voltage VSS is generally a ground voltage or a lower voltage level.

The gate terminals of the transistors T1 and T2 are coupled to the first positive input terminal PI1 and the first negative input terminal NI1 of the amplifier 210 respectively. The source terminals of the transistors T1 and T2 are both coupled to the first terminal of the third switch SW3. The drain terminals of the transistors T1 and T2 are both coupled to the output stage 240. Similarly, the gate terminals of the transistors T5 and T6 are coupled to the second positive input terminal PI2 and the second negative input terminal NI2 of the amplifier 210 respectively. The source terminals of the transistors T5 and T6 are both coupled to the first terminal of the fourth switch SW4. The drain terminals of the transistors T5 and T6 are both coupled to the output stage 240.

During the first period, the third switch SW3 is turned off while the fourth switch SW4 is turned on, so that the switchable bias current source 250 only provides the first bias current to the second input stage 230, here the first bias current is generated by the first bias current source CS1. During the second period, the third switch SW3 is turned on and the fourth switch SW4 is turned off, so that the switchable bias current source 250 only provides the first bias current to the first input stage 220, here the first bias current is still generated by the first bias current source CS1.

Figure 3B:
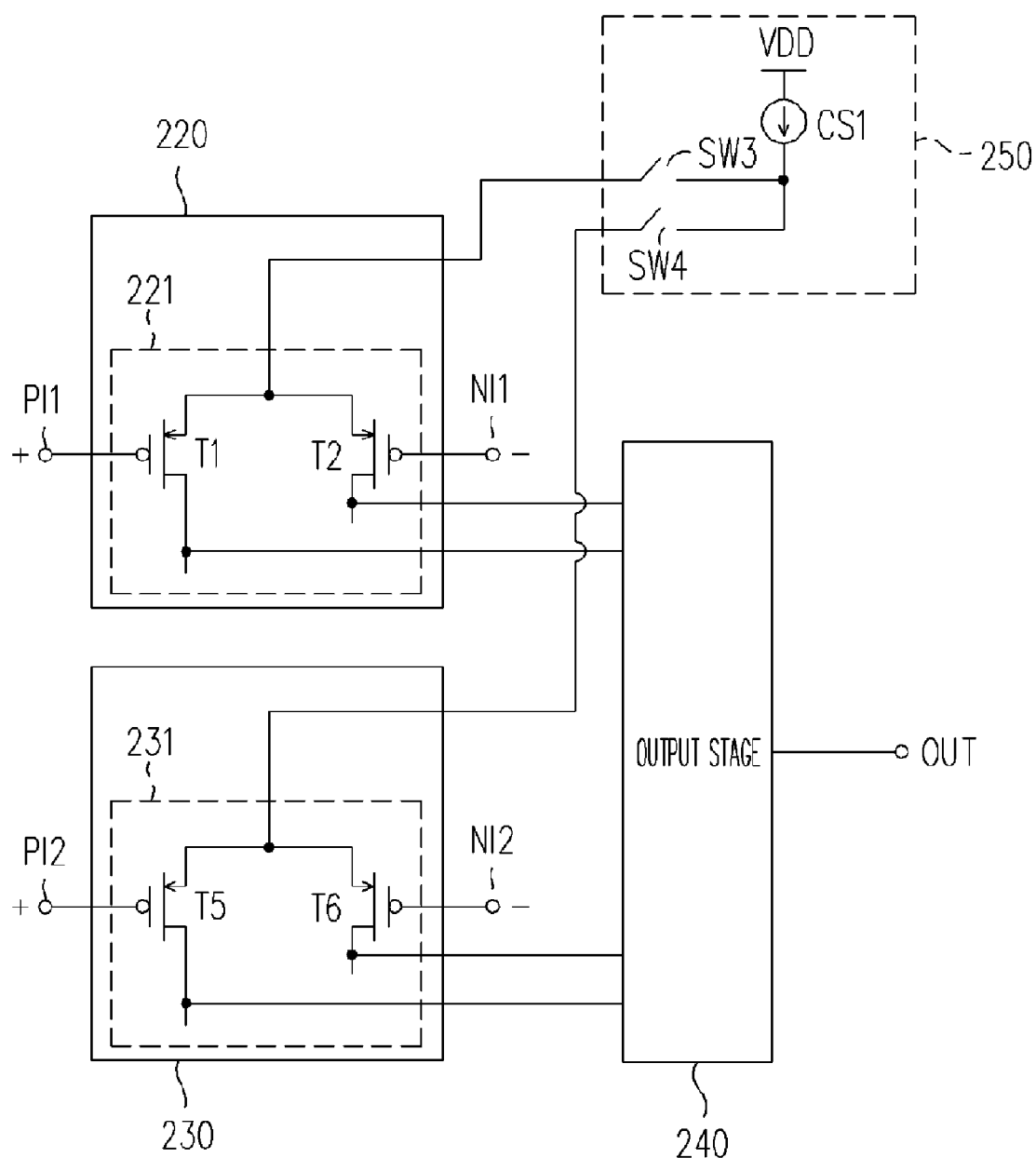

Referring to FIG. 3B, it illustrates another embodiment of the amplifier 210. The amplifier 210 includes the first input stage 220, the second input stage 230, the output stage 240 and the switchable bias current source 250. The first input stage 220 includes the differential input unit 221 which includes the first transistor T1 and the second transistor T2; the second input stage 230 includes the differential input unit 231 which includes the fifth transistor T5 and the sixth transistor T6. Here the transistors T1, T2, T5 and T6 are implemented with, for example, PMOS transistors. The switchable bias current source 250 includes the third switch SW3, the fourth switch SW4 and the first bias current source CS1; the power supply voltage VDD is a generally power supply voltage of higher voltage level or logic high voltage level.

The gate terminals of the transistors T1 and T2 are coupled to the first positive input terminal PI1 and the first negative input terminal NI1 of the amplifier 210 respectively. The source terminals of the transistors T1 and T2 are both coupled to the first terminal of the third switch SW3. The drain terminals of the transistors T1 and T2 are both coupled to the output stage 240. Similarly, the gate terminals of the transistors T5 and T6 are coupled to the second positive input terminal PI2 and the second negative input terminal NI2 of the amplifier 210 respectively. The source terminals of the transistors T5 and T6 are both coupled to the first terminal of the fourth switch SW4. The drain terminals of the transistors T5 and T6 are both coupled to the output stage 240.

During the first period, the third switch SW3 is turned off while the fourth switch SW4 is turned on, so that the switchable bias current source 250 only provides the first bias current generated by the first bias current source CS1 to the second input stage 230. And during the second period, the third switch SW3 is turned on while the fourth switch SW4 is turned off, so that the switchable bias current source 250 only provides the first bias current generated by the first bias current source CS1 to the first input stage 220.

FIG. 3B is similar to FIG. 3A, the difference is that the transistors of input stages 220 and 230 in FIG. 3A are NMOS transistors, but the transistors of the input stages 220 and 230 in FIG. 3B are PMOS transistors. Thus, the first bias current provided by the switchable bias current source 250 in FIG. 3B flows from a power supply voltage of higher voltage level or from logic high voltage level, but the first bias current in FIG. 3A flows to a ground voltage or a lower voltage level.

Figure 3C:
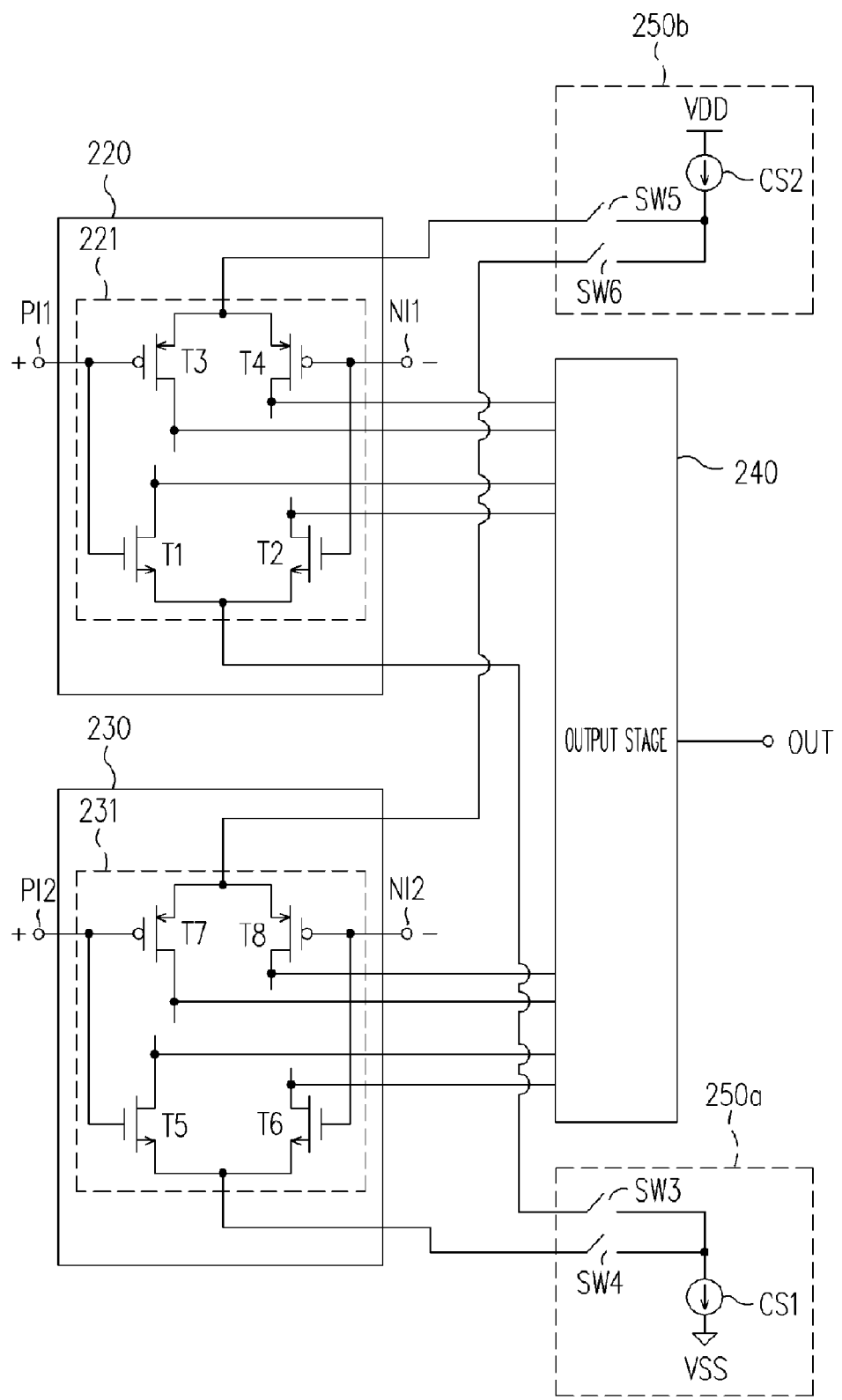

Referring to FIG. 3C, it illustrates yet another embodiment of the amplifier 210 for accomplishing the rail-to-rail requirement. The first input stage 220 includes the differential input unit 221 which includes the first transistor T1, the second transistor T2, the third transistor T3 and the fourth transistor T4; the second input stage 230 includes the differential input unit 231 which includes the fifth transistor T5, the sixth transistor T6, the seventh transistor T7 and the eighth transistor T8. In fact, the first input stage 220 and the second input stage 230 have the same structure. Here the transistors T1, T2, T5 and T6 are implemented with, for example, NMOS transistors, and transistors T3, T4, T7 and T8 are implemented with PMOS transistors.

In the present embodiment, the switchable bias current source 250 includes the first switchable bias current source 250a (i.e. the switchable bias current source 250 in FIG. 3A) and the second switchable bias current source 250b (i.e. the switchable bias current source 250 in FIG. 3B). In which, the first bias current source CS1 in the first switchable bias current source 250a provides the first bias current to bias the differential input pair constructed with NMOS transistors, while the second bias current source CS2 in the second switchable bias current source 250b provides the second bias current CS2 to bias the differential input pair constructed with PMOS transistors.

Since the third switch SW3 and the fifth switch SW5 bias the first input stage 220, they should be both turned on or both turned off, and since the fourth switch SW4 and the sixth switch SW6 bias the second input stage 230, they should be both turned on or both turned off, and during the same period, only either the first input stage 220 or the second input stage 230 will be biased to work properly.

Figure 3D:
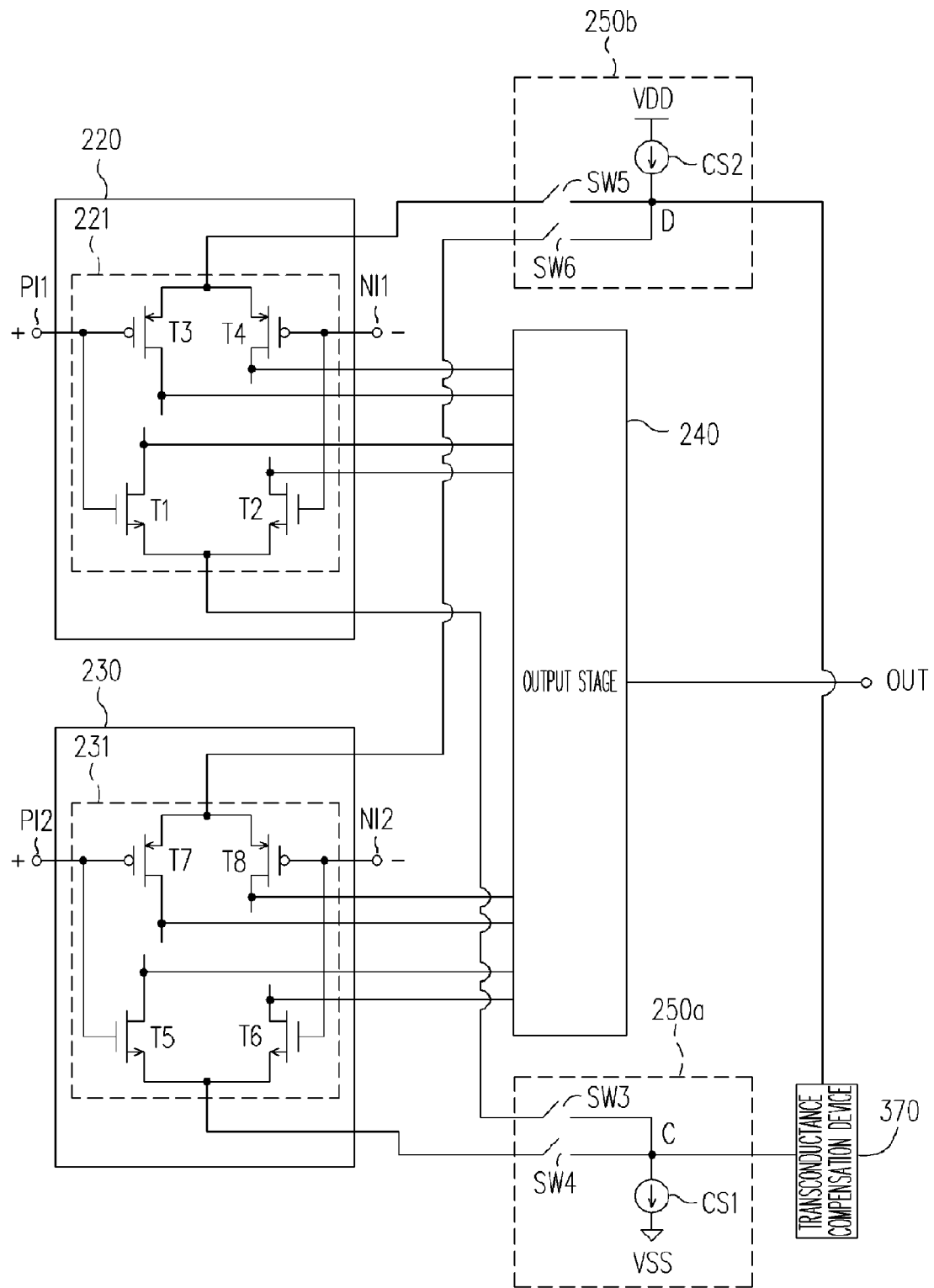

Referring to FIG. 3D, it illustrates another embodiment of the amplifier 210 for not only accomplishing the rail-to-rail requirement but also compensating the transconductance of the amplifier 210. FIG. 3D is similar to FIG. 3C, the difference is that there is a transconductance compensation device 370 in FIG. 3D which has its first terminal coupled to a common node C of the third switch SW3, the fourth switch SW4 and the first bias current source CS1; and its second terminal coupled to a common node D of the fifth switch SW5, the sixth switch SW6 and the second bias current source CS2.

Since the condition for the NMOS transistors to be turned on is that their gate-source voltage is greater than their threshold voltage, thus when the input signal $V_{in}$ is yet very small, neither transistors T1 and T2 nor transistors T5 and T6 will be turned on. Accordingly, the transconductance of the amplifier 210 will be decreased (because transconductance is in direct ratio with the extraction of the current, i.e. $g_m \propto \sqrt{I}$), here the transconductance compensation device 370 may be turned on to provide current to compensate for the transconductance of the amplifier 210. Similar situation may happen to PMOS transistors when the input signal $V_{in}$ is very big, and the transconductance compensation device 370 may be turned on to compensate for the transconductance of the amplifier 210.

Figure 4A:
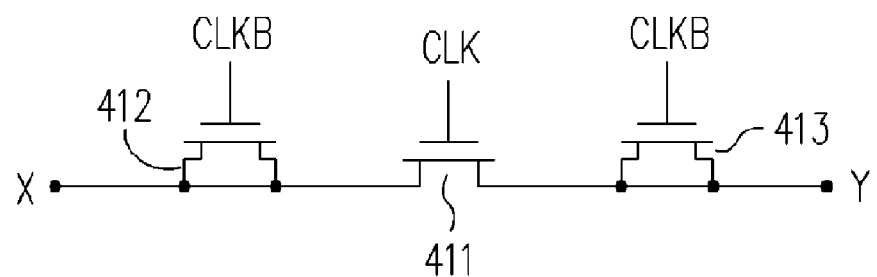
FIGS. 4A~4C are diagrams illustrating the switches of a sample-and-hold device according to an exemplary embodiment of the present invention.
Figure 4B:
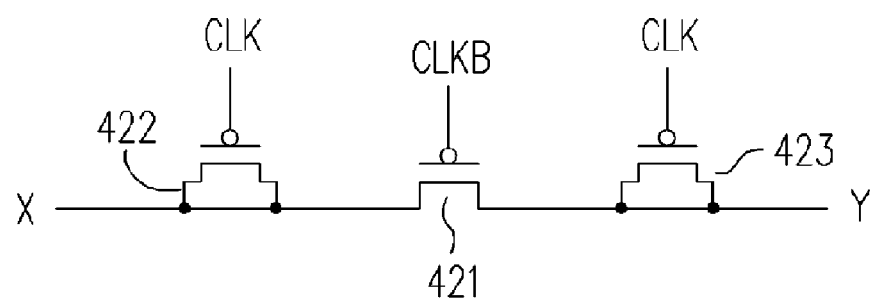
Figure 4C:
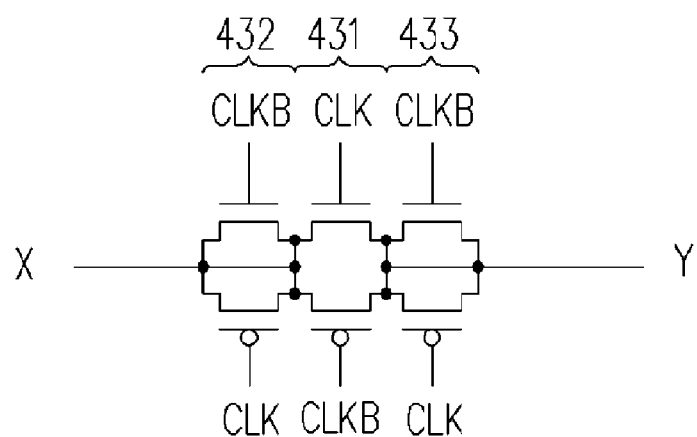

FIGS. 4A~4C are diagrams illustrating the switches of the sample-and-hold device 200 according to an exemplary embodiment of the present invention. Referring to FIG. 4A, it is an embodiment of the switches which are formed by the switch transistor 411, the pseudo switch transistor 412 and the pseudo switch transistor 413 in series. Here the transistors 411, 412 and 413 are all NMOS transistors. The transistors 411, 412 and 413 are controlled respectively by using the control clock CLK and the inverted control clock CLKB.

When the control clock CLK is at a high level (i.e. the inverted control clock CLKB is at a low level), a large quantity of electrons congregated between the source terminal and drain terminal of the transistor 411 to form the N channel, so that a conductive path between nodes X and Y is formed. When the control clock CLK changes from high level to low level, the large quantity of electrons congregated between the source terminal and drain terminal of the transistor 411 will be injected into both sides of the channel to destroy the N channel, so that a open circuit is formed between nodes X and Y. However, the large quantity of electrons originally formed the N channel will generate charge injection during dispersion, thus the pseudo switch transistors 412 and 413 should be disposed at both sides of the switch transistor 411, by changing the inverted control clock CLKB to high level to make the transistors 412 and 413 form the N channel respectively so as to attract the electrons injected from the switch transistor 411. Certainly, to save the surface area of the circuit, one of the pseudo switch transistors can be left out or both pseudo switch transistors can be omitted.

Certainly, the switches are not limited to be implemented by NMOS transistors. FIG. 4B illustrates the other implementation of switches using PMOS transistor 421 and pseudo switch transistors 422, 423. FIG. 4C illustrates another implementation of switches using transmission gate 431 and pseudo transmission gates 432, 433 as switches. According to the description of the method for implementing switches in FIG. 4A, those skilled in the art should be able to implement switches with PMOS transistors or transmission gates, thus here the detail is not described again.

Figure 5A:
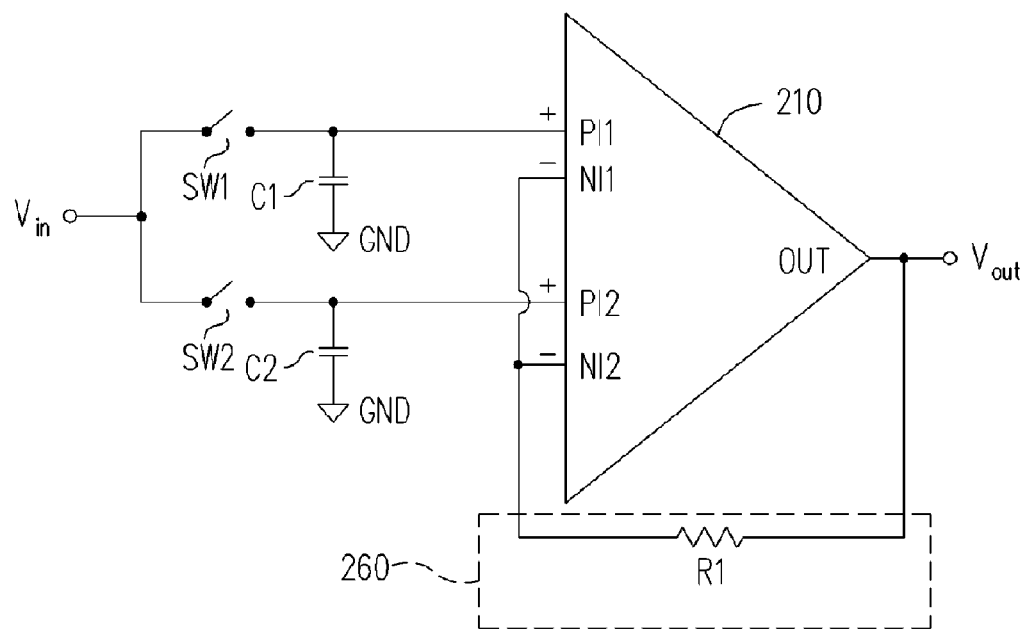
FIGS. 5A~5B are diagrams illustrating the feedback network of a sample-and-hold device according to an exemplary embodiment of the present invention.
Figure 5B:
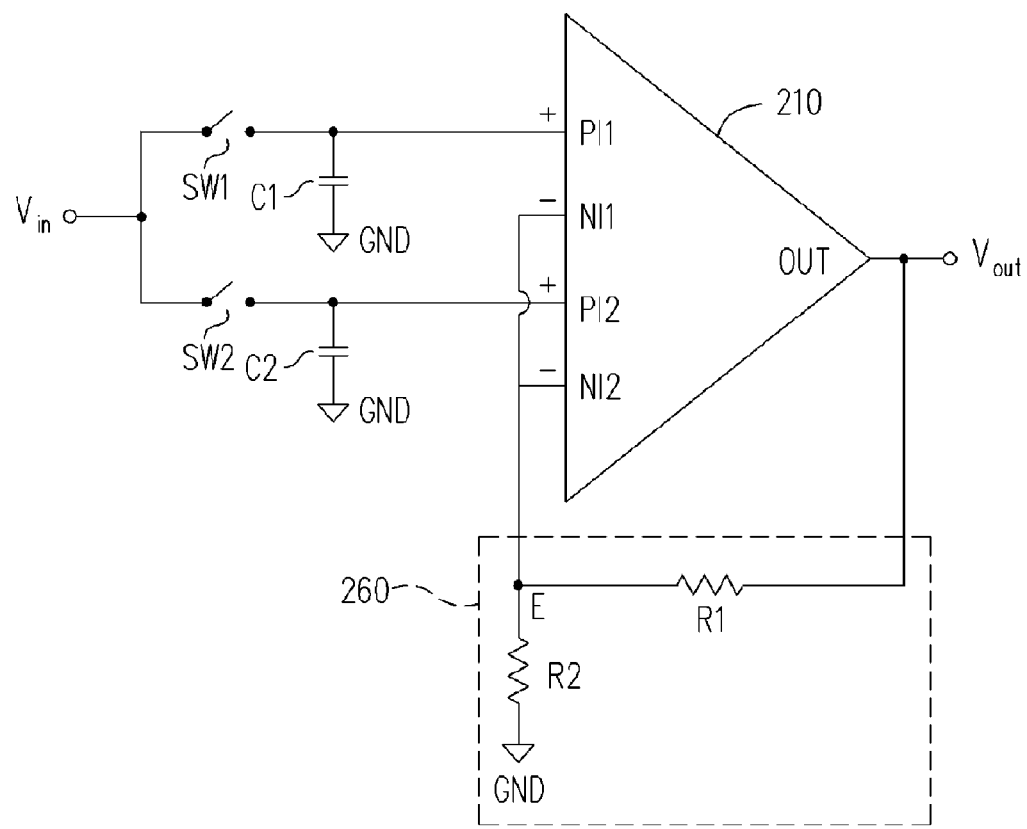

FIGS. 5A~5B are diagrams illustrating the feedback network 260 of the sample-and-hold device 200 according to an exemplary embodiment of the present invention. Referring to FIG. 5A, the feedback network 260 of the present embodiment includes a resistor R1. The first terminal of the resistor R1 is coupled to the output terminal OUT of the amplifier 210, and the second terminal is coupled to the first negative input terminal NI1 and the second negative input terminal NI2 of the amplifier 210. In an embodiment, the resistance of the resistor R1 is zero, so the feedback network 260 is constructed with a conductive wire, such as the feedback network of the sample-and-hold device 100 in FIG. 1.

Referring to FIG. 5B, it is another embodiment of the feedback network 260 which includes the first resistor R1 and the second resistor R2. The first resistor R1 and the second resistor R2 are coupled in series between the output terminal OUT of the amplifier 210 and the third voltage (a ground voltage GND in the present example); a common node E of the first resistor R1 and the second resistor R2 is coupled to the first negative input terminal NI1 and the second negative input terminal NI2 of the amplifier 210. In the present embodiment, the voltage of node E is $V_{out}*R2/(R1+R2)$.

Figure 6:
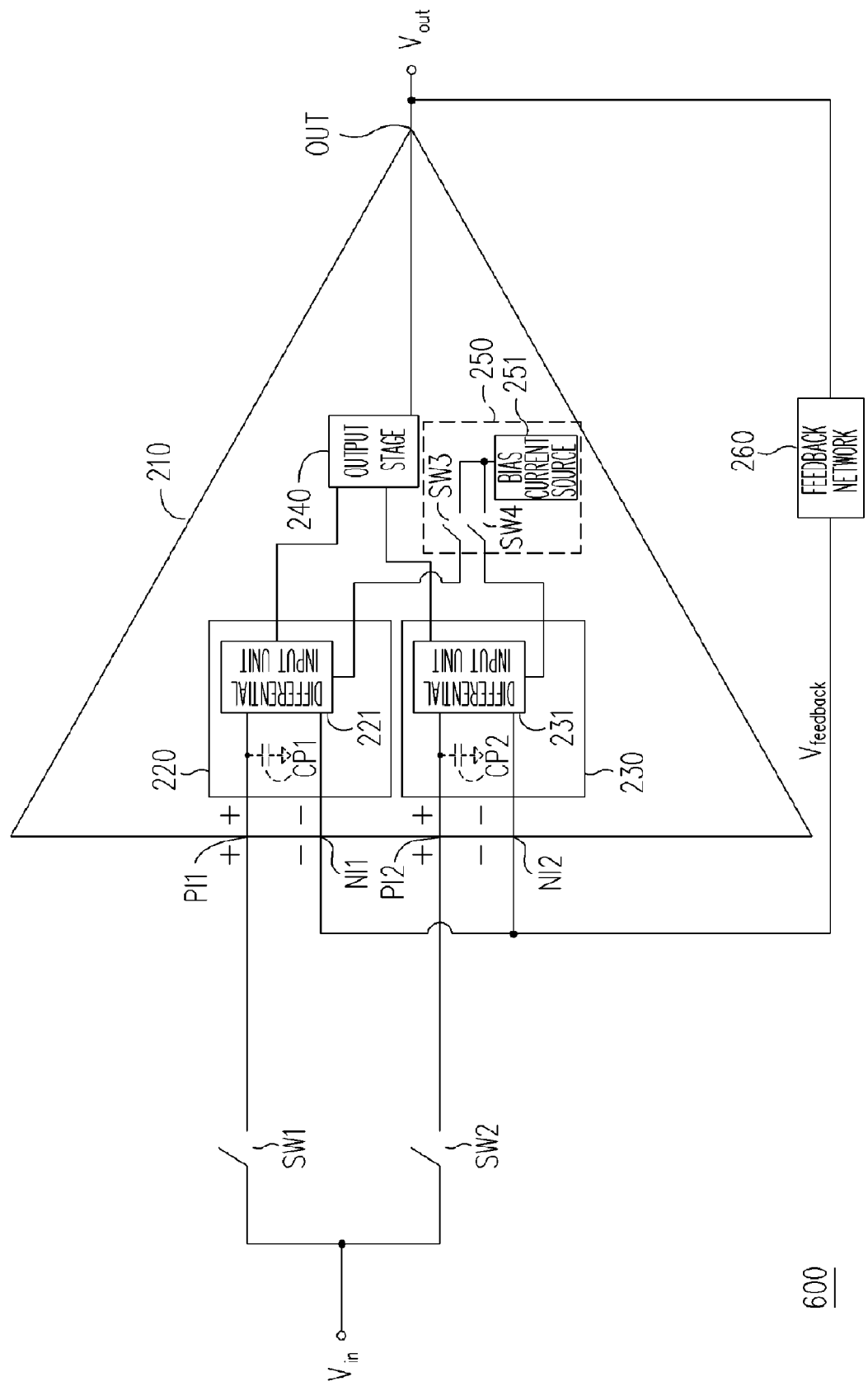
FIG. 6 is a circuit diagram illustrating a sample-and-hold device having a plurality of input stages according to another exemplary embodiment of the present invention; in the embodiment, the sample-and hold device has two input stages.

FIG. 6 is a circuit diagram illustrating a sample-and-hold device having a plurality of input stages according to another exemplary embodiment of the present invention. The sample-and-hold device of this embodiment has two input stages. Referring to FIG. 6, the sample-and-hold device 600 is similar to the sample-and-hold device 200 in FIG. 2, the difference is that the first capacitor C1 and the second capacitor C2 in the sample-and-hold device 200 are removed. Instead, only the first parasitic capacitor CP1 and the second parasitic capacitor CP2 are used to sample the input signal $V_{in}$ in the sample-and-hold device 600. Accordingly, smaller chip area can be achieved for implementing the sample-and-hold device. Yet, since the capacitance of parasitic capacitors is usually very small so that the sample-and-hold device 600 can only be used in some certain applications.

In overview, since the input stages of the amplifier are coupled to the capacitors used for sampling data without going through switches according to the present invention, and the switches are disposed in the amplifier, thus the output distortion incurred by charge sharing can be avoided. In addition, with a plurality of input stages sharing one single bias current source, the present invention can reduce the chip size, increase the response speed of the amplifier and avoid voltage spike.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A sample-and-hold device, comprising:
an amplifier having at least first and a second positive input terminals, first and second negative input terminals, and an output terminal, the amplifier comprising:
a first input stage coupled to the first positive input terminal and the first negative input terminal;
a second input stage coupled to the second positive input terminal and the second negative input terminal;
a switchable bias current source used to provide a first bias current to bias the first and second input stages, wherein the switchable bias current source switches the first bias current to the first input stage during a second period, and switches the first bias current to the second input stage during a first period; and
an output stage coupled to the first and second input stages to provide an output signal to the output terminal according to outputs of the first and second input stages;
a feedback network used to provide a feedback signal to the first and second negative input terminals according to the output signal;
a first capacitor;
a second capacitor;
a first switch which is coupled in series with the first capacitor between an input signal and a first voltage, and a common node of the first switch and the first capacitor is coupled to the first positive input terminal, wherein the first switch is turned on during the first period to transmit the input signal to the first capacitor to store a first sampling result of the input signal in the first capacitor, and the first switch is turned off during the second period; and
a second switch which is coupled in series with the second capacitor between the input signal and a second voltage, and a common node of the second switch and the second capacitor is coupled to the second positive input terminal, wherein the second switch is turned on during the second period to transmit the input signal to the second capacitor to store a second sampling result of the input signal in the second capacitor, and the second switch is turned off during the first period;

wherein the feedback network comprises a first and second resistors coupled in series between the output terminal and a third voltage, and a common node of the first and second resistors is coupled to the first and second negative input terminals.

2. The sample-and-hold device as claimed in claim 1, wherein the first voltage, the second voltage and the third voltage are ground voltages.

3. The sample-and-hold device as claimed in claim 1, wherein the switchable bias current source comprises:
a first bias current source having its first terminal coupled to a fourth voltage to provide the first bias current;
a third switch having its first terminal coupled to the first input stage and its second terminal coupled to a second terminal of the first bias current source, wherein the third switch is turned on during the second period to transmit the first bias current to the first input stage, and the third switch is turned off during the first period; and
a fourth switch having its first terminal coupled to the second input stage and its second terminal coupled to the second terminal of the first bias current source, wherein the fourth switch is turned on during the first period to transmit the first bias current to the second input stage, and the fourth switch is turned off during the second period;
the first input stage comprises:
a first transistor having its gate terminal coupled to the first positive input terminal, its first source/drain terminal coupled to the first terminal of the third switch, and its second source/drain terminal coupled to the output stage; and
a second transistor having its gate terminal coupled to the first negative input terminal, its first source/drain terminal coupled to the first terminal of the third switch, and its second source/drain terminal coupled to the output stage; and
the second input stage comprises:
a fifth transistor having its gate terminal coupled to the second positive input terminal, its first source/drain terminal coupled to the first terminal of the fourth switch, and its second source/drain terminal coupled to the output stage; and
a sixth transistor having its gate terminal coupled to the second negative input terminal, its first source/drain terminal coupled to the first terminal of the fourth switch, and its second source/drain terminal coupled to the output stage.

4. The sample-and-hold device as claimed in claim 3, wherein the first transistor, the second transistor, the fifth transistor and the sixth transistor are NMOS transistors, and the fourth voltage is a ground voltage.

5. The sample-and-hold device as claimed in claim 3, wherein the first transistor, the second transistor, the fifth transistor and the sixth transistor are PMOS transistors, and the fourth voltage is a power supply voltage.

6. The sample-and-hold device as claimed in claim 3, wherein the switchable bias current source further comprises:
a second bias current source having its first terminal coupled to a fifth voltage to provide a second bias current;
a fifth switch having its first terminal coupled to the first input stage and its second terminal coupled to a second terminal of the second bias current source, wherein the fifth switch is turned on during the second period to transmit the second bias current to the first input stage, and the fifth switch is turned off during the first period; and a sixth switch having its first terminal coupled to the second input stage and its second terminal coupled to the second terminal of the second bias current source, wherein the sixth switch is turned on during the first period to transmit the second bias current to the second input stage, and the sixth switch is turned off during the second period;

the first input stage further comprises:

a third transistor having its gate terminal coupled to the first positive input terminal, its first source/drain terminal coupled to the first terminal of the fifth switch, and its second source/drain terminal coupled to the output stage; and a fourth transistor having its gate terminal coupled to the first negative input terminal, its first source/drain terminal coupled to the first terminal of the fifth switch, and its second source/drain terminal coupled to the output stage; and the second input stage further comprises:

a seventh transistor having its gate terminal coupled to the second positive input terminal, its first source/drain terminal coupled to the first terminal of the sixth switch, and its second source/drain terminal coupled to the output stage; and an eighth transistor having its gate terminal coupled to the second negative input terminal, its first source/drain terminal coupled to the first terminal of the sixth switch, and its second source/drain terminal coupled to the output stage.

7. The sample-and-hold device as claimed in claim 6, wherein the first transistor, the second transistor, the fifth transistor and the sixth transistor are NMOS transistors, the third transistor, the fourth transistor, the seventh transistor and the eighth transistor are PMOS transistors, the fourth voltage is a ground voltage, and the fifth voltage is a power supply voltage.

8. The sample-and-hold device as claimed in claim 6, wherein the amplifier further comprises:

a transconductance compensation device having its first terminal coupled to a common node of the first bias current source, the third switch and the fourth switch, and its second terminal coupled to a common node of the second bias current source, the fifth switch and the sixth switch, the transconductance compensation device being used for compensating the transconductance of the amplifier.

9. A sample-and-hold device, comprising:

an amplifier having at least first and second positive input terminals, first and second negative input terminals, and an output terminal, the amplifier comprising:

a first input stage coupled to the first positive input terminal and the first negative input terminal, wherein the first input stage has a first parasitic capacitor coupled to the first positive input terminal;

a second input stage coupled to the second positive input terminal and the second negative input terminal, wherein the second input stage has a second parasitic capacitor coupled to the second positive input terminal;

a switchable bias current source used to provide a first bias current to bias the first and second input stages, wherein the switchable bias current source switches the first bias current to the first input stage during a second period, and switches the first bias current to the second input stage during a first period; and an output stage coupled to the first and second input stages to provide an output signal to the output terminal according to outputs of the first and second input stages;

a feedback network used to provide a feedback signal to the first and second negative input terminals according to the output signal;

a first switch having its first terminal coupled to an input signal and its second terminal coupled to the first positive input terminal, wherein the first switch is turned on during the first period to transmit the input signal to the first parasitic capacitor to store a first sampling result of the input signal in the first parasitic capacitor, and the first switch is turned off during the second period; and a second switch having its first terminal coupled to the input signal and its second terminal coupled to the second positive input terminal, wherein the second switch is turned on during the second period to transmit the input signal to the second parasitic capacitor to store a second sampling result of the input signal in the second parasitic capacitor, and the second switch is turned off during the first period;

wherein the feedback network comprises a first and second resistors coupled in series between the output terminal and a thrid voltage, and a common node of the first and second resistors is coupled to the first and second negative input terminals.

10. The sample-and-hold device as claimed in claim 9, wherein the third voltage is ground voltage.

11. The sample-and-hold device as claimed in claim 9, wherein the switchable bias current source comprises:

a first bias current source having its first terminal coupled to a fourth voltage to provide the first bias current;

a third switch having its first terminal coupled to the first input stage and its second terminal coupled to a second terminal of the first bias current source, wherein the third switch is turned on during the second period to transmit the first bias current to the first input stage, and the third switch is turned off during the first period; and a fourth switch having its first terminal coupled to the second input stage and its second terminal coupled to the second terminal of the first bias current source, wherein the fourth switch is turned on during the first period to transmit the first bias current to the second input stage, and the fourth switch is turned off during the second period;

the first input stage comprises a first and second transistors having their gate terminals coupled to the first positive input terminal and the first negative input terminal respectively, their first source/drain terminals both coupled to the first terminal of the third switch, and their second source/drain terminals both coupled to the output stage; and the second input stage comprises a fifth and a sixth transistors having their gate terminals coupled to the second positive input terminal and the second negative input terminal respectively, their first source/drain terminals both coupled to the first terminal of the fourth switch, and their second source/drain terminals both coupled to the output stage.

12. The sample-and-hold device as claimed in claim 11, wherein the first transistor, the second transistor, the fifth transistor and the sixth transistor are NMOS transistors, and the fourth voltage is a ground voltage.

13. The sample-and-hold device as claimed in claim 11, wherein the first transistor, the second transistor, the fifth transistor and the sixth transistor are PMOS transistors, and the fourth voltage is a power supply voltage.

14. The sample-and-hold device as claimed in claim 11, wherein the switchable bias current source further comprises:
- a second bias current source having its first terminal coupled to a fifth voltage to provide a second bias current;
- a fifth switch having its first terminal coupled to the first input stage and its second terminal coupled to a second terminal of the second bias current source, wherein the fifth switch is turned on during the second period to transmit the second bias current to the first input stage, and the fifth switch is turned off during the first period; and
- a sixth switch having its first terminal coupled to the second input stage and its second terminal coupled to the second terminal of the second bias current source, wherein the sixth switch is turned on during the first period to transmit the second bias current to the second input stage, and the sixth switch is turned off during the second period;
- the first input stage further comprises a third and a fourth transistors having their gate terminals coupled to the first positive input terminal and the first negative input terminal respectively, their first source/drain terminals both coupled to the first terminal of the fifth switch, and their second source/drain terminals both coupled to the output stage; and
- the second input stage further comprises a seventh and an eighth transistors having their gate terminals coupled to the second positive input terminal and the second negative input terminal respectively, their first source/drain terminals both coupled to the first terminal of the sixth switch, and their second source/drain terminals both coupled to the output stage.

15. The sample-and-hold device as claimed in claim 14, wherein the first transistor, the second transistor, the fifth transistor and the sixth transistor are NMOS transistors, the third transistor, the fourth transistor, the seventh transistor and the eighth transistor are PMOS transistors, the fourth voltage is a ground voltage, and the fifth voltage is a power supply voltage.

16. The sample-and-hold device as claimed in claim 14, wherein the amplifier further comprises:
- a transconductance compensation device having its first terminal coupled to a common node of the first bias current source, the third switch and the fourth switch, and its second terminal coupled to a common node of the second bias current source, the fifth switch and the sixth switch, the transconductance compensation device being used for compensating the transconductance of the amplifier.

* * * * *